(12) United States Patent
Ito et al.

(10) Patent No.: US 10,438,904 B2
(45) Date of Patent: Oct. 8, 2019

(54) SEMICONDUCTOR DEVICE

(71) Applicant: TOSHIBA MEMORY CORPORATION, Minato-ku (JP)

(72) Inventors: Sachiyo Ito, Kawasaki (JP); Tatsuhiro Oda, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/984,548

(22) Filed: May 21, 2018

(65) Prior Publication Data

US 2019/0172794 A1 Jun. 6, 2019

(30) Foreign Application Priority Data

Dec. 5, 2017 (JP) .................. 2017-233289

(51) Int. Cl.
| | |
|---|---|
| *H01L 23/00* | (2006.01) |
| *H01L 27/11556* | (2017.01) |
| *H01L 27/11582* | (2017.01) |
| *H01L 21/762* | (2006.01) |
| *H01L 27/11521* | (2017.01) |
| *H01L 23/535* | (2006.01) |
| *H01L 21/74* | (2006.01) |
| *H01L 27/11568* | (2017.01) |

(52) U.S. Cl.
CPC .......... *H01L 23/562* (2013.01); *H01L 21/743* (2013.01); *H01L 21/76224* (2013.01); *H01L 23/535* (2013.01); *H01L 27/11521* (2013.01); *H01L 27/11556* (2013.01); *H01L 27/11568* (2013.01); *H01L 27/11582* (2013.01)

(58) Field of Classification Search
CPC ................ H01L 23/562; H01L 23/535; H01L 27/11521; H01L 27/11556; H01L 27/11568; H01L 27/11582
See application file for complete search history.

(56) References Cited

U.S. PATENT DOCUMENTS

| | | | |
|---|---|---|---|
| 2014/0070302 A1 | 3/2014 | Yoo et al. | |
| 2019/0067314 A1* | 2/2019 | Lu ..................... | H01L 27/11575 |

FOREIGN PATENT DOCUMENTS

JP 2014-57067 3/2014

* cited by examiner

*Primary Examiner* — Matthew L Reames
(74) *Attorney, Agent, or Firm* — Oblon, McClelland, Maier & Neustadt, L.L.P.

(57) ABSTRACT

According to one embodiment, a semiconductor device includes a substrate, a stacked body, a plurality of columnar portions, a separation portion, and a wall portion. The separation portion extends through the stacked body in a first direction and separates the stacked body into a plurality of blocks in a second direction. The separation portion includes a conductive material contacting the substrate. The wall portion is disposed between the separation portion and a columnar portion of the plurality of columnar portions most proximal to the separation portion. The wall portion pierces a lowermost electrode layer of the plurality of electrode layers and pierces an interface between the substrate and the stacked body.

19 Claims, 24 Drawing Sheets

SEMICONDUCTOR DEVICE

CROSS-REFERENCE TO RELATED APPLICATION

This application is based upon and claims the benefit of priority from Japanese Patent Application No. 2017-233289, filed on Dec. 5, 2017; the entire contents of which are incorporated herein by reference.

FIELD

Embodiments described herein relate generally to a semiconductor device.

BACKGROUND

A memory device has been proposed to have a three-dimensional structure including multiple electrode layers stacked on a substrate, and a semiconductor body piercing the multiple electrode layers and reaching the substrate. In such a three-dimensional memory device, a structure has been proposed in which a conductive material that contacts the substrate is provided inside a slit formed in a stacked body; and a current is caused to flow between the semiconductor body and the conductive material via the substrate.

DETAILED DESCRIPTION

Figure 1:
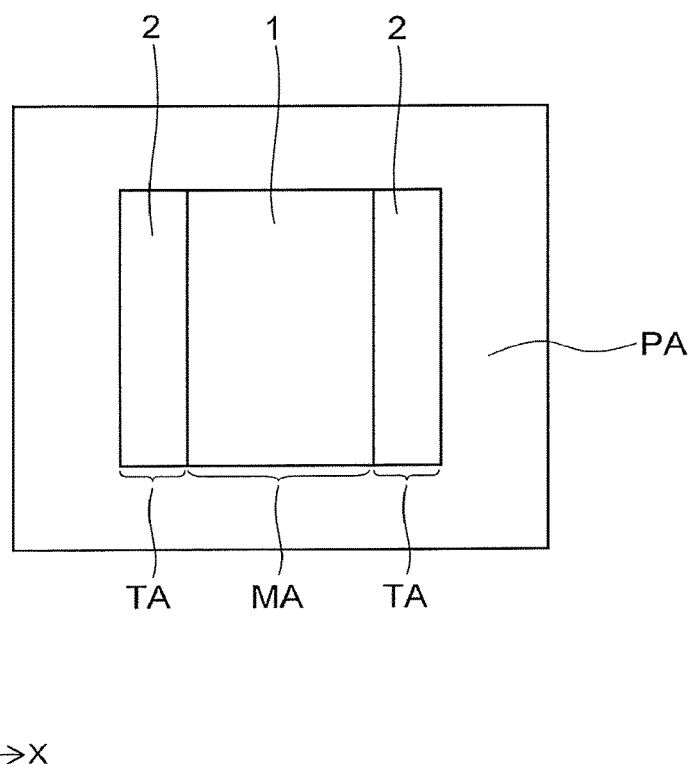
FIG. 1 is a schematic block plan view of a semiconductor device according to an embodiment of the invention.

According to one embodiment, a semiconductor device includes a substrate, a stacked body, a plurality of columnar portions, a separation portion, and a wall portion. The stacked body is provided above the substrate. The stacked body includes a plurality of electrode layers stacked with an insulator interposed. The columnar portions extend through the stacked body in a stacking direction of the stacked body. The separation portion extends through the stacked body in a first direction and separates the stacked body into a plurality of blocks in a second direction. The second direction crosses the first direction. The separation portion includes a conductive material contacting the substrate. The wall portion is disposed between the separation portion and a columnar portion of the plurality of columnar portions most proximal to the separation portion. The wall portion pierces a lowermost electrode layer of the plurality of electrode layers and pierces an interface between the substrate and the stacked body.

Embodiments of the invention will now be described with reference to the drawings. In the drawings, the same components are marked with the same reference numerals; and a detailed description is omitted as appropriate. The drawings are schematic; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In the embodiments, for example, a semiconductor memory device that includes a memory cell array having a three-dimensional structure is described as the semiconductor device.

FIG. 1 is a schematic block plan view of the semiconductor device according to the embodiment of the invention.

The semiconductor device of the embodiment includes a memory region MA, a terrace region (or a staircase region) TA, and a peripheral region PA. A memory cell array 1 is provided in the memory region MA. A staircase portion 2 is provided in the terrace region TA. A circuit portion that controls the memory cell array 1 is provided in the peripheral region PA. The memory cell array 1, the staircase portion 2, and the circuit portion are provided on the same substrate.

Figure 2:
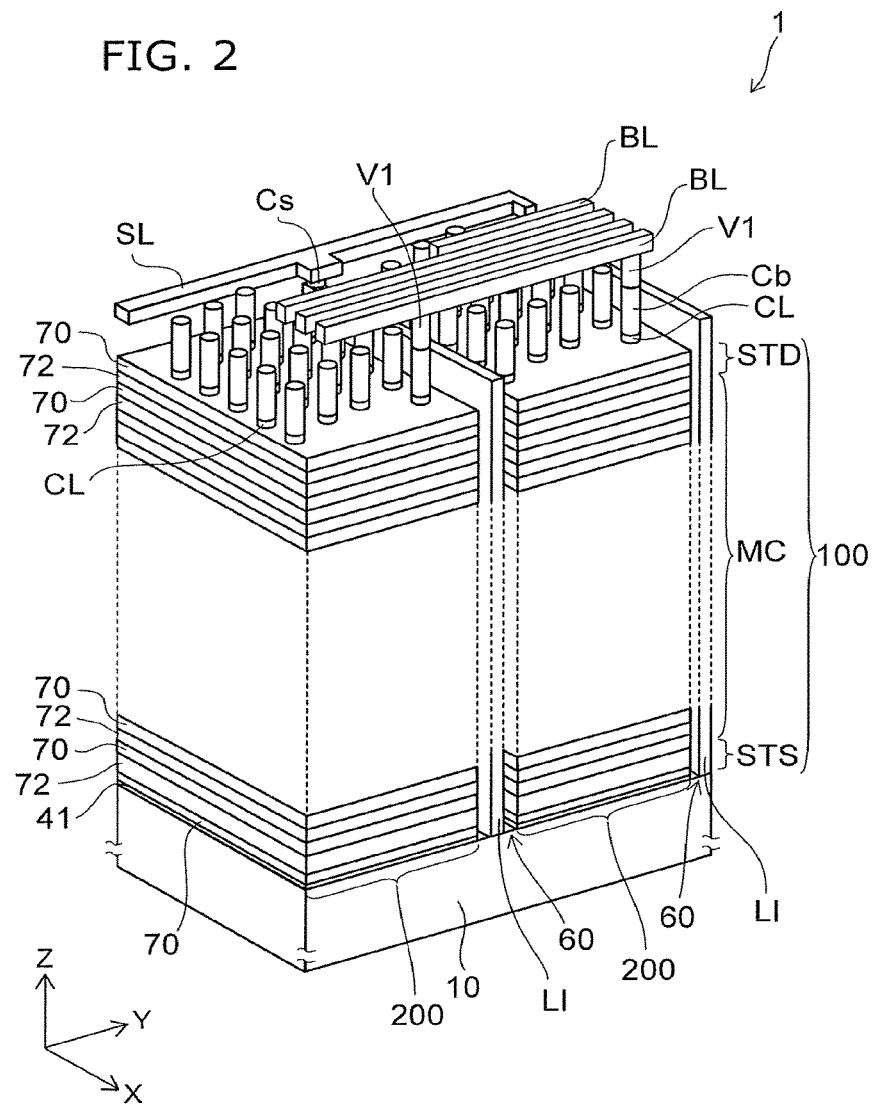
FIG. 2 is a schematic perspective view of a memory cell array of the semiconductor device according to the embodiment of the invention.

FIG. 2 is a schematic perspective view of the memory cell array 1.

Figure 3:
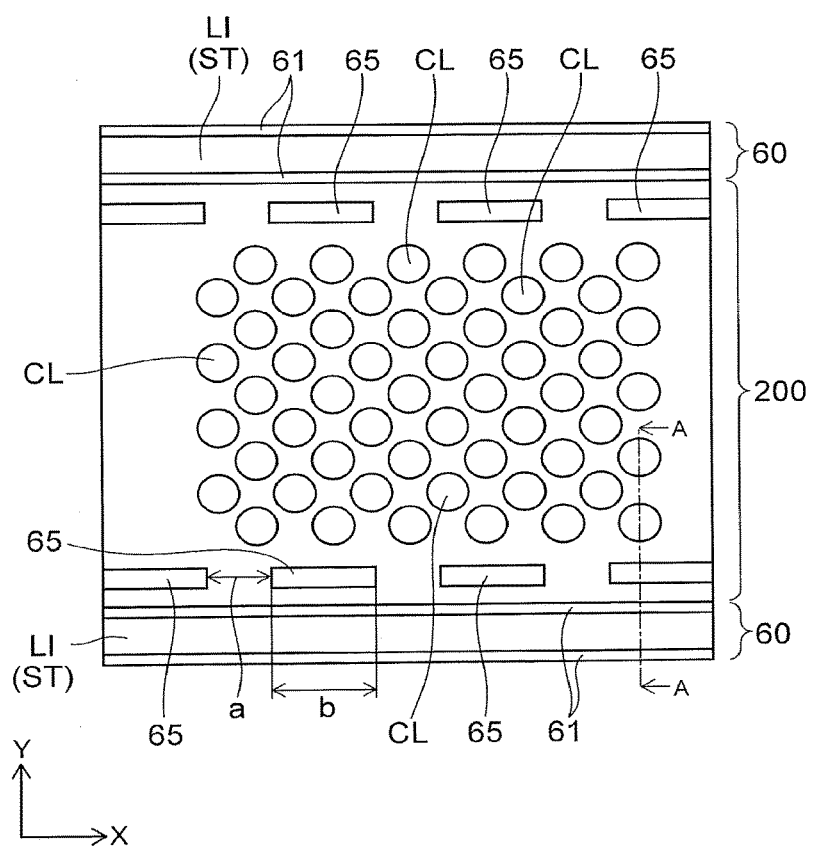
FIG. 3 is a schematic plan view of the memory cell array of the semiconductor device according to the embodiment of the invention.

FIG. 3 is a schematic plan view of the memory cell array 1.

Figure 4:
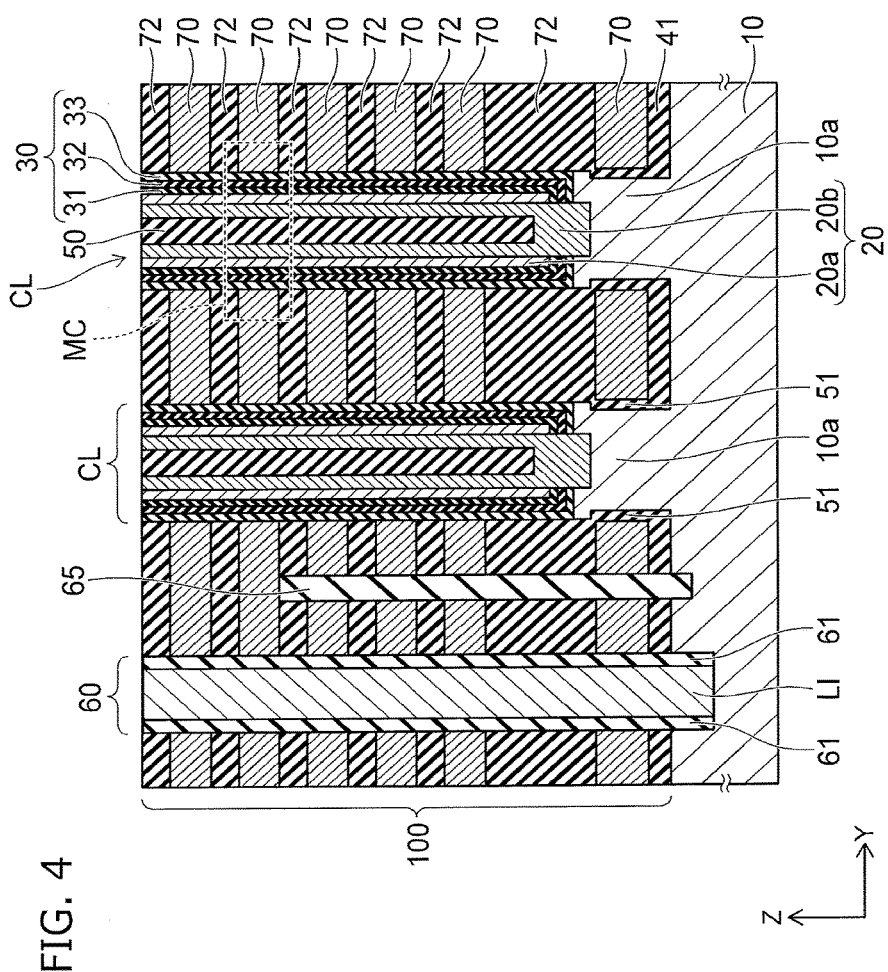
FIG. 4 is an A-A cross-sectional view of FIG. 3.

FIG. 4 is an A-A cross-sectional view of FIG. 3.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction of the other drawings correspond respectively to the X-direction, the Y-direction, and the Z-direction shown in FIG. 2.

The memory cell array 1 includes the substrate 10, a stacked body 100, multiple columnar portions CL, multiple separation portions 60, and upper layer interconnects provided above the stacked body 100. In FIG. 2, bit lines BL and a source line SL are shown as the upper layer interconnects.

The separation portions 60 extend in the stacking direction of the stacked body 100 (the Z-direction), and reach the substrate 10. Also, the separation portions 60 extend in the X-direction, and divide the stacked body 100 into multiple blocks (or fingers) 200 in the Y-direction.

The columnar portions CL are formed in substantially circular columnar configurations extending through the stacked body 100 in the stacking direction (the Z-direction). For example, the multiple columnar portions CL have a staggered arrangement. Or, the multiple columnar portions CL may be arranged in a square lattice along the X-direction and the Y-direction.

The multiple bit lines BL are, for example, metal films extending in the Y-direction. The multiple bit lines BL are separated from each other in the X-direction. The upper ends of semiconductor bodies 20 of the columnar portions CL described below are connected to the bit lines BL via contacts Cb and contacts V1.

The stacked body 100 includes multiple electrode layers 70 stacked in a direction (the Z-direction) perpendicular to the major surface of the substrate 10. The multiple electrode layers 70 are stacked in the Z-direction with insulating layers (insulating bodies) 72 interposed. The insulating bodies between the electrode layers 70 may be air gaps.

As shown in FIG. 4, the substrate 10 includes multiple protrusions 10a. The substrate 10 including the protrusions 10a is a semiconductor substrate, and is, for example, a silicon substrate.

The electrode layers 70 are metal layers, and are, for example, tungsten layers or molybdenum layers. An insulating layer 41 is provided between the substrate 10 and the lowermost electrode layer 70.

The protrusions 10a protrude higher than the interface between the stacked body 100 and the substrate 10, i.e., the interface between the insulating layer 41 and the substrate 10. The columnar portions CL are provided on the protrusions 10a. The protrusions 10a having columnar configurations are provided under the columnar portions CL. The multiple protrusions 10a are provided to correspond to the multiple columnar portions CL.

As described below, the protrusions 10a are silicon crystal layers epitaxially grown on the bottom portions of holes reaching the substrate 10.

The upper ends of the protrusions 10a are positioned at a height between the lowermost electrode layer 70 and the electrode layer 70 of the second layer from the bottom.

The lowermost electrode layer 70 surrounds peripheries of the protrusions 10a having the columnar configurations. The lowermost electrode layer 70 is positioned at a height lower than the lower ends of the columnar portions CL.

An insulating film 51 is provided between the lowermost electrode layer 70 and the side surfaces of the protrusions 10a. The side surfaces of the protrusions 10a are covered with the lowermost insulating layer 72, the insulating film 51, and the insulating layer 41.

The columnar portion CL includes a memory film 30, the semiconductor body 20, and an insulative core film 50. The semiconductor body 20 is formed in a pipe-like configuration; and the core film 50 is provided on the inner side of the semiconductor body 20. The memory film 30 is provided between the semiconductor body 20 and the electrode layers 70 higher than the protrusions 10a, and surrounds the periphery of the semiconductor body 20.

For example, the semiconductor body 20 is a silicon film; and the lower end of the semiconductor body 20 contacts the protrusion 10a. The upper end of the semiconductor body 20 is connected to the bit line BL via the contact Cb and the contact V1 shown in FIG. 2.

The memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided in order from the electrode layer 70 side between the semiconductor body 20 and the electrode layers 70.

The semiconductor body 20, the memory film 30, and the electrode layer 70 are included in a memory cell MC. The memory cell MC has a vertical transistor structure in which the electrode layer 70 surrounds the periphery of the semiconductor body 20 with the memory film 30 interposed.

In the memory cell MC having the vertical transistor structure, the semiconductor body 20 functions as a channel; and the electrode layer 70 functions as a control gate. The charge storage film 32 functions as a data storage layer that stores the charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage portion may be a conductive floating gate surrounded with an insulator.

The tunneling insulating film 31 is used as a potential barrier when the charge is injected from the semiconductor body 20 into the charge storage film 32 or when the charge that is stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

As shown in FIG. 2, a drain-side selection transistor STD is provided in the upper layer portion of the stacked body 100; and a source-side selection transistor STS is provided in the lower layer portion of the stacked body 100.

Among the multiple electrode layers 70, it is possible for at least the uppermost electrode layer 70 to function as a control gate of the drain-side selection transistor STD; and it is possible for at least the lowermost electrode layer 70 to function as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL. The multiple memory cells MC are provided three-dimensionally in the X-direction, the Y-direction, and the Z-direction.

As shown in FIG. 3 and FIG. 4, the separation portion 60 includes a conductive material (or interconnect portion) LI and an insulating film 61. The insulating film 61 is not illustrated in FIG. 2.

The conductive material LI is a film that spreads in the X-direction and the Z-direction, and includes, for example, at least one of silicon or a metal. The insulating film 61 is provided at the side surface of the conductive material LI. The insulating film 61 is provided between the stacked body 100 and the conductive material LI.

The lower end of the conductive material LI contacts the substrate 10. The upper end of the conductive material LI is connected to the source line SL via a contact Cs shown in FIG. 2.

The terrace region TA and the peripheral region PA will now be described.

Figure 5:
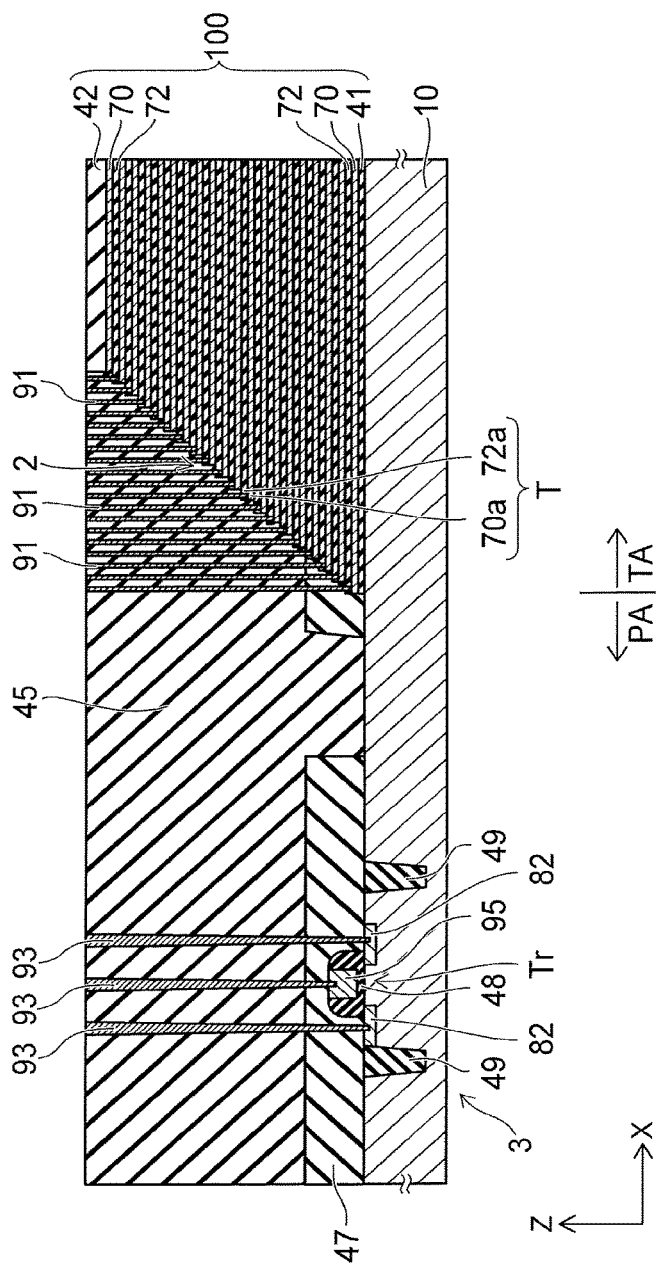
FIG. 5 is a schematic cross-sectional view of a terrace region and a peripheral region of the semiconductor device according to the embodiment of the invention.

FIG. 5 is a schematic cross-sectional view of the terrace region TA and the peripheral region PA.

The stacked body 100 and the separation portion 60 extend in the X-direction from the memory region MA to the terrace region TA. The substrate 10 also is provided in the terrace region TA.

A portion of the stacked body 100 is patterned into a staircase configuration; and the multiple electrode layers 70 include multiple terrace portions 70a arranged in a staircase configuration by level differences being formed along the X-direction. The multiple insulating layers 72 also are patterned into a staircase configuration; and the multiple insulating layers 72 include multiple terrace portions 72a arranged in a staircase configuration by level differences being formed along the X-direction.

The terrace portion 70a of the electrode layer 70 and the terrace portion 72a of the insulating layer 72 are included in a terrace portion T of the stacked body 100. One terrace portion T includes one terrace portion 70a, and one terrace portion 72a stacked on the one terrace portion 70a.

The staircase portion 2 is formed of the multiple terrace portions T. For each of the terrace portions T, the electrode layers 70 of the other layers above the terrace portion T do not overlap the terrace portion T.

An insulating layer 45 is provided on the staircase portion 2. The insulating layer 45 fills the level differences between the multiple terrace portions T.

The separation portions 60 divide the insulating layer 45 in the terrace region TA and the stacked body 100 under the insulating layer 45 in the terrace region TA into the multiple blocks 200 in the Y-direction.

Contact portions 91 are provided above the terrace portions T. At least one contact portion 91 is disposed for one terrace portion T. The multiple contact portions 91 are provided on the staircase portion 2 to correspond to the multiple terrace portions T.

The contact portion 91 is a conductive body having a substantially circular columnar configuration. The contact portion 91 is a metal body, and includes, for example, tungsten or molybdenum as a major component.

The contact portion 91 extends through the insulating layer 45 in the stacking direction of the stacked body 100, and contacts the terrace portion 70a of the electrode layer 70. The contact portion 91 is connected to a not-illustrated upper layer interconnect (a word interconnect). The upper layer interconnect is electrically connected to a circuit portion 3 described below. The potentials of the electrode layers 70 of the memory cell array 1 are controlled via the contact portions 91 and the terrace portions 70a.

The peripheral region PA will now be described.

The substrate 10 is provided also in the peripheral region PA. The surface region (the active region) of the substrate 10 of the peripheral region PA and the surface region (the active region) of the substrate 10 of the terrace region TA and memory region MA are separated by an element separation portion 49. For example, the element separation portion 49 has a STI (shallow trench isolation) structure in which an insulating film is filled into a trench.

The circuit portion 3 including a transistor Tr is provided in the peripheral region PA. Although only one transistor Tr is illustrated in FIG. 5, the circuit portion 3 includes multiple transistors Tr. The multiple transistors Tr are separated from each other by the element separation portion 49.

The transistor Tr includes a gate electrode 95, a gate insulating film 48, and semiconductor regions 82 used to form a source region or a drain region. The semiconductor regions 82 are formed in the surface of the substrate 10. The gate electrode 95 is provided, with the gate insulating film 48 interposed, on the region (the channel region) between the semiconductor regions 82 at the surface of the substrate 10.

An insulating layer 47 is provided on the substrate 10 of the peripheral region PA to cover the transistor Tr. The insulating layer 45 is provided on the insulating layer 47.

The transistor Tr is connected to not-illustrated upper layer interconnects provided on the insulating layer 45 via contact portions 93. The contact portions 93 extend through the insulating layer 45 and the insulating layer 47 in the Z-direction and are connected to the gate electrode 95 and the semiconductor regions 82 of the transistor Tr.

A wall portion 65 that is disposed in the memory region MA will now be described with reference to FIG. 3 and FIG. 4.

The wall portion 65 is disposed between the separation portion 60 and the columnar portion CL of the multiple columnar portions CL most proximal to the separation portion 60. The wall portion 65 is not disposed between the columnar portion CL and the columnar portion CL.

The wall portion 65 extends in the stacked body 100 in the stacking direction (the Z-direction), and pierces at least the lowermost electrode layer 70 and the interface between the substrate 10 and the stacked body 100 (the interface between the substrate 10 and the insulating layer 41). In the example shown in FIG. 4, the wall portion 65 pierces the electrode layers 70 of the four layers on the lower layer side but does not pierce the electrode layers 70 on the upper layer side other than the four layers.

The lower end of the wall portion 65 reaches the substrate 10 and is positioned at a height that is lower than the protrusion 10a. The upper end of the wall portion 65 is positioned at a height that is higher than the upper end of the protrusion 10a. The lowermost electrode layer 70 and the interface between the substrate 10 and the stacked body 100 are positioned at heights between the upper end and the lower end of the wall portion 65.

For example, the wall portion 65 is formed from an insulating film such as a silicon oxide film, an aluminum oxide film, etc. It is sufficient for an insulating film to be provided in the wall portion 65 on at least the side surface contacting the electrode layers 70; and a conductive material may be provided in the wall portion 65 in portions not contacting the electrode layers 70.

The lower end of the wall portion 65 is positioned higher than the lower end of the conductive material LI of the separation portion 60. The lower end of the wall portion 65 is positioned at a height that is between the lower end of the conductive material LI and the interface between the substrate 10 and the stacked body 100.

As shown in FIG. 3, multiple wall portions 65 are arranged in the X-direction to be separated from each other. A spacing a between the multiple wall portions 65 adjacent to each other in the X-direction is smaller than a length b in the X-direction of one wall portion 65. For example, the length b of one wall portion 65 is not less than 50 nm but less than 1.5 μm.

The width in the Y-direction of the wall portion 65 is narrower than the width in the Y-direction of the conductive material LI. For example, the width in the Y-direction of the wall portion 65 is not less than 30 nm but less than 100 nm.

In a read operation, electrons are supplied to the semiconductor body 20 from the conductive material LI via the protrusion 10a and the surface of the substrate 10.

The lowermost electrode layer 70 functions as a control gate of a bottom transistor; and the insulating layer 41 and the insulating film 51 shown in FIG. 4 function as a gate insulating film of the bottom transistor. The bottom transistor has a structure in which the lowermost electrode layer 70 surrounds the periphery of the protrusion 10a with the insulating film 51 interposed. Also, the lowermost electrode layer 70 opposes the surface (the upper surface) of the substrate 10 with the insulating layer 41 interposed.

By controlling the potential applied to the lowermost electrode layer 70, an inversion layer (e.g., an n-channel) can be induced at the vicinity of the surface of the substrate 10 and the vicinity of the side surface of the protrusion 10a;

and a current can be caused to flow between the lower end of the conductive material LI and the lower end of the semiconductor body 20 via the protrusion 10a and the surface of the substrate 10.

Figure 24:
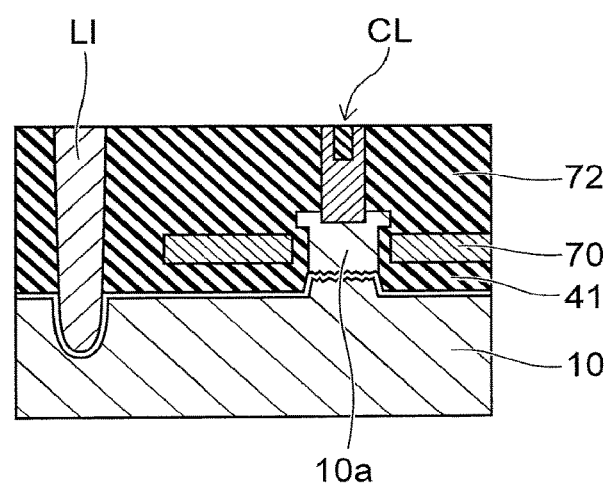
FIG. 24 is a schematic cross-sectional view showing a defect occurring at the vicinity of the conductive material.

FIG. 24 is a schematic cross-sectional view showing a defect occurring at the vicinity of the conductive material LI.

Tensile stress may be generated in the conductive material LI by high-temperature annealing performed after forming the conductive material LI. If the tensile stress concentrates at the lower end (the bottom portion) of the conductive material LI, the lower end of the conductive material LI peels from the substrate 10. Then, in the case where a crack propagates from the peeling location along the surface of the substrate 10 (the interface between the substrate 10 and the stacked body 100) and reaches the protrusion 10a, the protrusion 10a may be broken vertically. This may cause a conduction defect between the conductive material LI and the semiconductor body 20 via the substrate 10.

For example, in the case where amorphous silicon is formed as the conductive material LI, the amorphous silicon is polycrystallized by the high-temperature annealing recited above. Due to the polycrystallization, volume contraction of the conductive material LI occurs and may cause tensile stress in the conductive material LI. Or, in the case where tungsten is used as the conductive material LI, the tungsten easily undergoes tensile stress in the film formation.

Also, as described below, the insulating film 51 is formed by thermal oxidation of the side surface of the protrusion 10a. Due to the volume expansion due to the thermal oxidation, the protrusion 10a easily undergoes tensile stress along the vertical direction. This also causes the protrusion 10a to break easily vertically when the crack recited above reaches the protrusion 10a.

Therefore, according to the embodiment as shown in FIG. 3 and FIG. 4, the wall portion 65 is disposed between the separation portion 60 and the columnar portion CL of the multiple columnar portions CL most proximal to the separation portion 60.

The crack due to the peeling of the lower end of the conductive material LI recited above may propagate along the interface between the insulating layer 41 and the lowermost electrode layer 70, or the interface between the substrate 10 and the insulating layer 41. The wall portion 65 pierces these interfaces. Such a wall portion 65 functions as a stopper (a crack stopper) of the crack propagating from the conductive material LI to the protrusion 10a via these interfaces.

Even in the case where the lower end of the conductive material LI peels from the substrate 10 and the crack propagates along the interface recited above toward the protrusion 10a, the wall portion 65 stops the propagation of the crack. Accordingly, the conduction defect between the conductive material LI and the semiconductor body 20 due to the protrusion 10a being broken vertically can be prevented.

Even in the case where the peeling of the lower end of the conductive material LI occurs, not all of the portions in the X-direction peel from the substrate 10; only a portion of the lower end where the tensile stress concentrates peels; and the contact between the conductive material LI and the substrate 10 is maintained.

The current flows between the conductive material LI and the protrusion 10a through the surface of the substrate 10 in the region between the wall portion 65 and the wall portion 65 arranged in the X-direction. Also, in the region where the wall portion 65 is disposed, the current can flow through the surface of the substrate 10 below the lower end of the wall portion 65. As shown in FIG. 4, by setting the lower end of the wall portion 65 to be positioned at a height that is higher than the lower end of the conductive material LI, the current path between the conductive material LI and the protrusion 10a can be short, that is, the resistance can be low compared to the case where the lower end of the wall portion 65 is positioned at a height that is lower than the lower end of the conductive material LI.

A method for manufacturing the semiconductor device of the embodiment will now be described with reference to FIG. 6 to FIG. 22.

FIG. 6 to FIG. 14 show processes for the memory region MA; and FIG. 15 to FIG. 22 show processes for the terrace region TA and the peripheral region PA.

Figure 15:
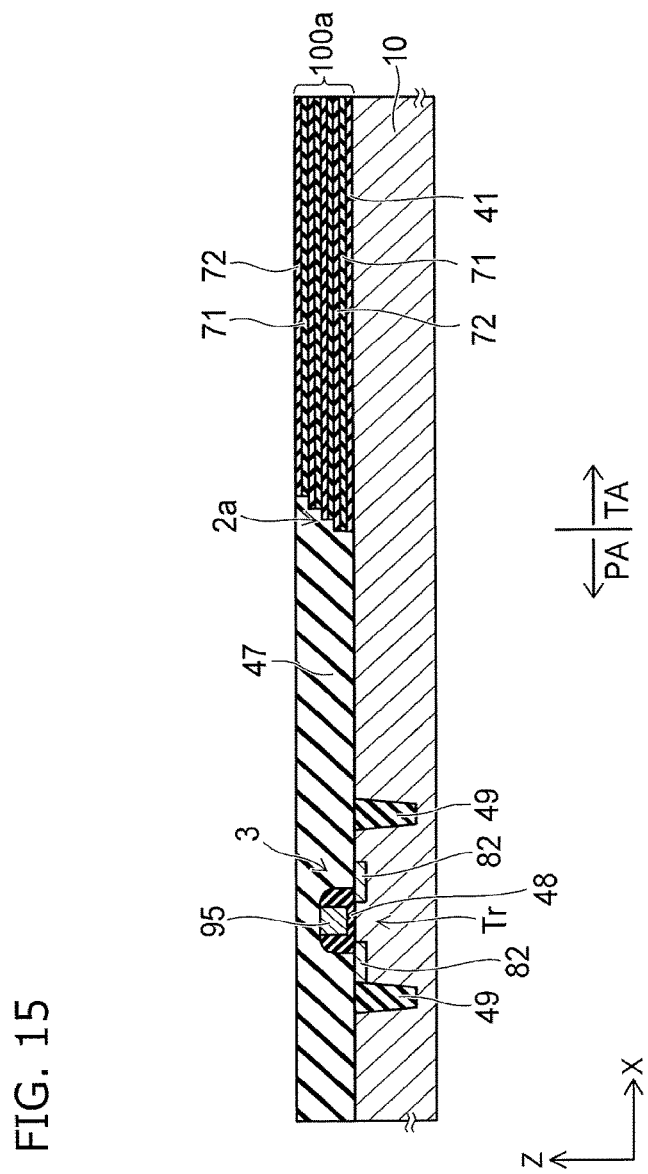

As shown in FIG. 15, the element separation portions 49 are formed in the surface of the substrate 10 in the peripheral region PA. The transistor Tr including the semiconductor regions 82, the gate insulating film 48, and the gate electrode 95 is formed in the region that is subdivided by the element separation portions 49. The circuit portion 3 including the multiple transistors Tr is formed in the peripheral region PA. The insulating layer 47 is formed on the substrate 10 of the peripheral region PA to cover the circuit portion 3.

Figure 6:
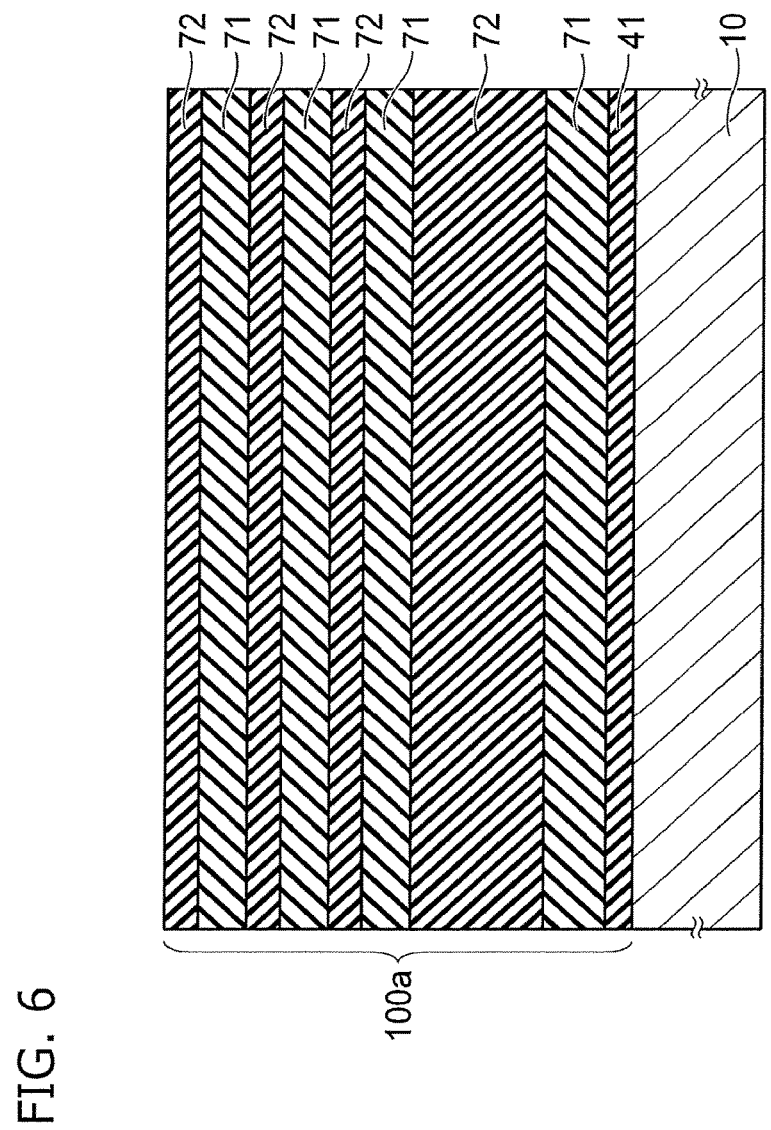
FIG. 6 to FIG. 22 are schematic cross-sectional views showing a method for manufacturing the semiconductor device according to the embodiment of the invention.

On the other hand, as shown in FIG. 6, a portion (a lower layer portion) 100a of the stacked body 100 is formed on the substrate 10 in the terrace region TA and the memory region MA. The lower layer portion 100a includes multiple sacrificial layers (first layers) 71 and multiple insulating layers (second layers) 72. The insulating layer 41 is formed between the surface of the substrate 10 and the lowermost sacrificial layer 71. For example, the sacrificial layers 71 are silicon nitride layers; and the insulating layers 72 are silicon oxide layers.

Figure 7:
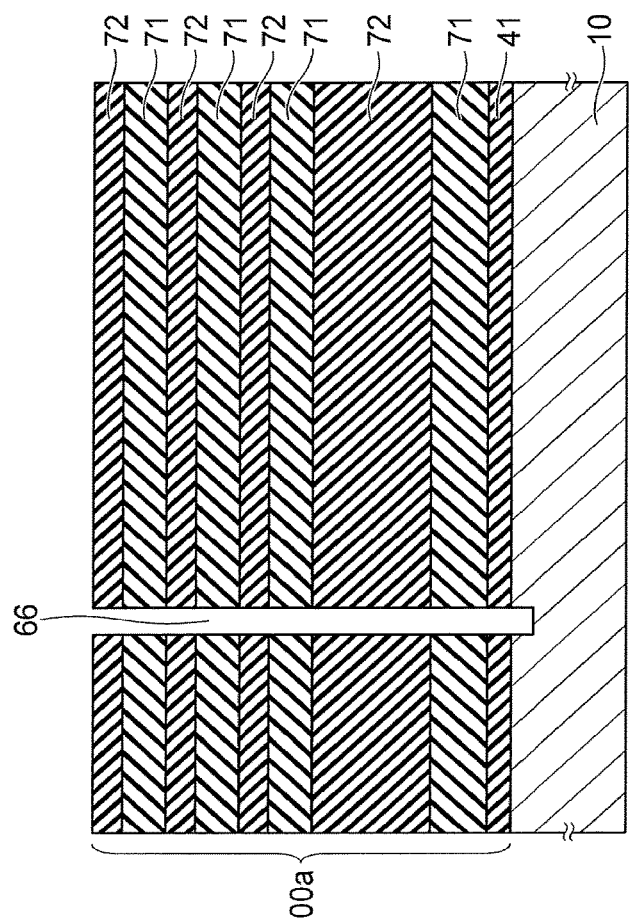

After forming the lower layer portion 100a, slits 66 that pierce the lower layer portion 100a and reach the substrate 10 are formed as shown in FIG. 7. The multiple slits 66 are formed in the same arrangement (layout) as the multiple wall portions 65 shown in FIG. 3. For example, the slits 66 are formed by RIE (Reactive Ion Etching) using a not-illustrated mask.

Figure 8:
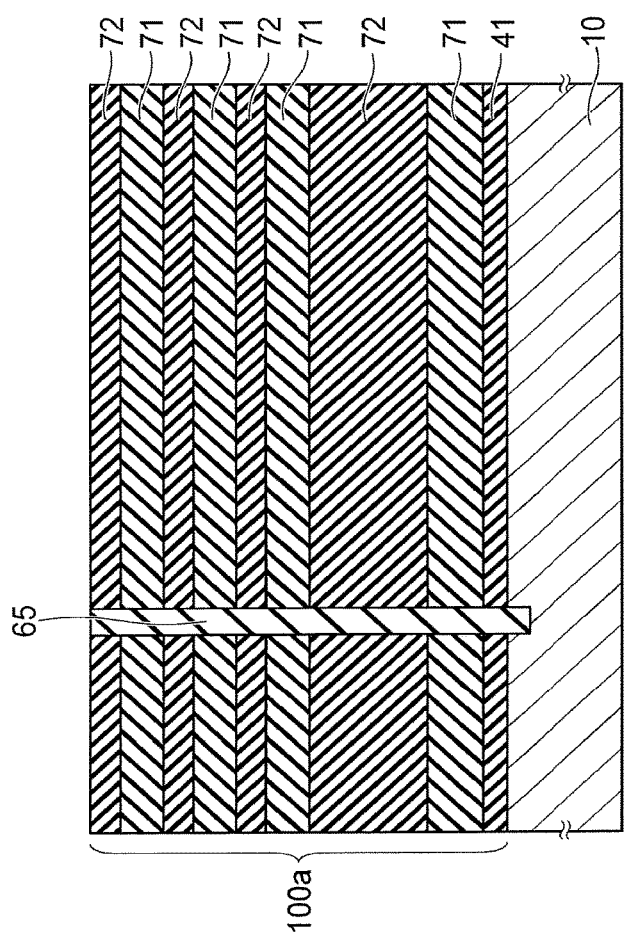

An insulating film is filled into the slit 66; and the wall portion 65 is formed as shown in FIG. 8. The insulating film that forms the wall portion 65 is, for example, a silicon oxide film or an aluminum oxide film, and includes a material that is different from that of the sacrificial layer 71 which is a silicon nitride layer.

After forming the wall portion 65 in the memory region MA, a staircase portion 2a which is a portion of the staircase portion 2 described above is formed in a portion of the lower layer portion 100a provided in the terrace region TA as shown in FIG. 15. The staircase portion 2a is covered with the insulating layer 47.

Figure 16:
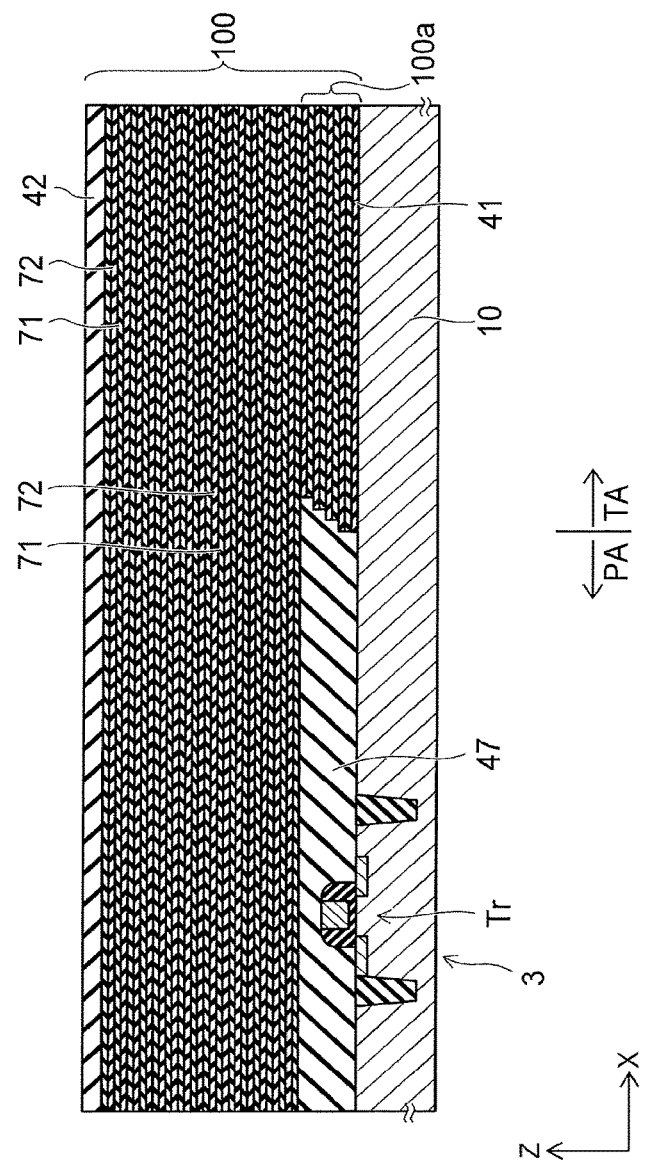

As shown in FIG. 16, the stacked body 100 is formed on the insulating layer 47 and on the lower layer portion 100a. The stacked body 100 including the multiple sacrificial layers 71 and the multiple insulating layers 72 is formed continuously in the memory region MA, the terrace region TA, and the peripheral region PA. An insulating layer 42 is formed on the uppermost sacrificial layer 71.

Figure 17:
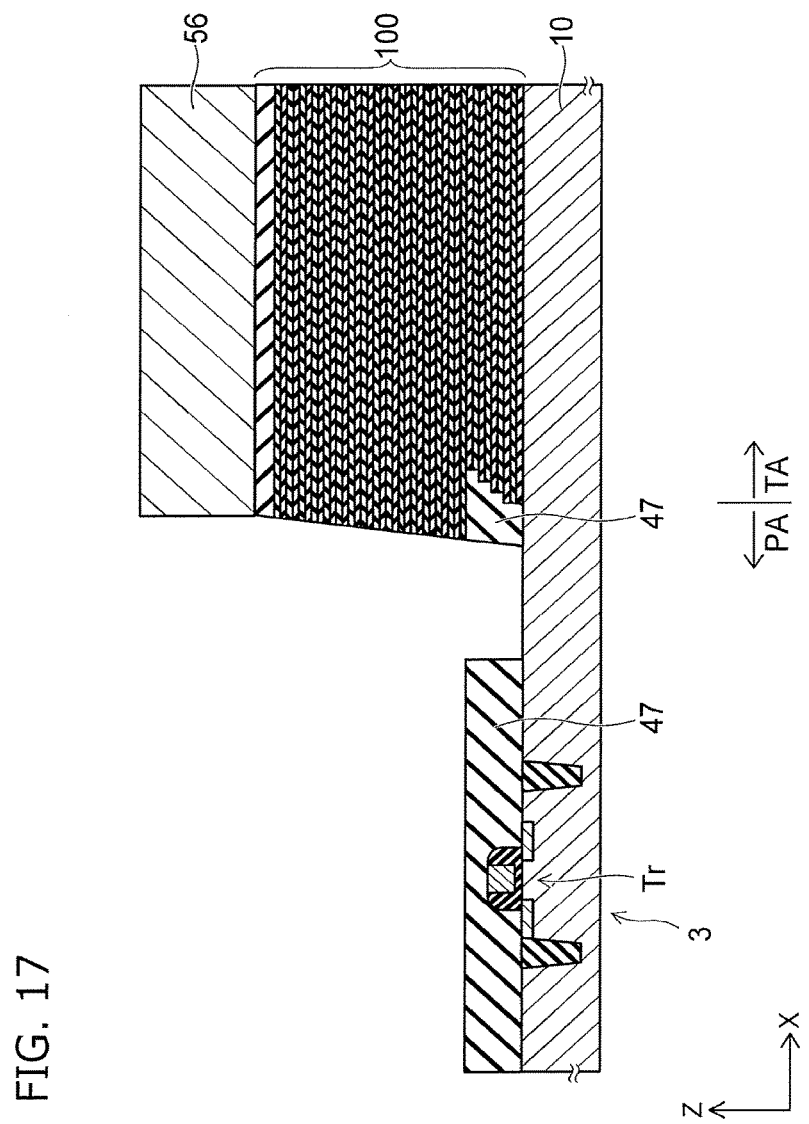
Figure 18:
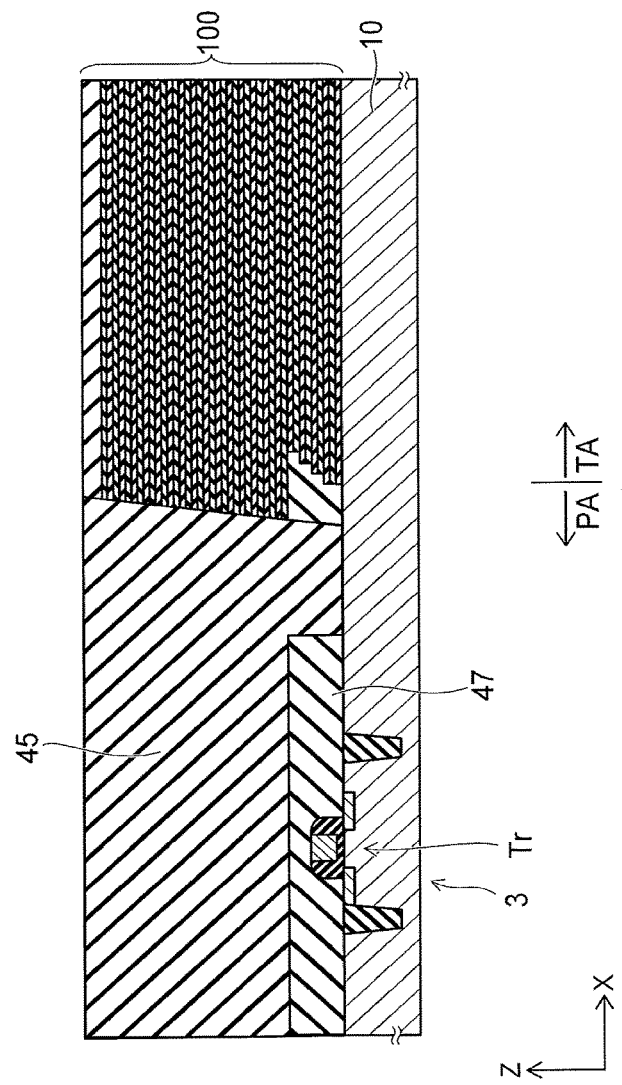

For example, the stacked body 100 on the peripheral region PA is removed by RIE using a mask layer 56 shown in FIG. 17. As shown in FIG. 18, the insulating layer 45 is filled into the portion where the stacked body 100 is removed.

Figure 19:
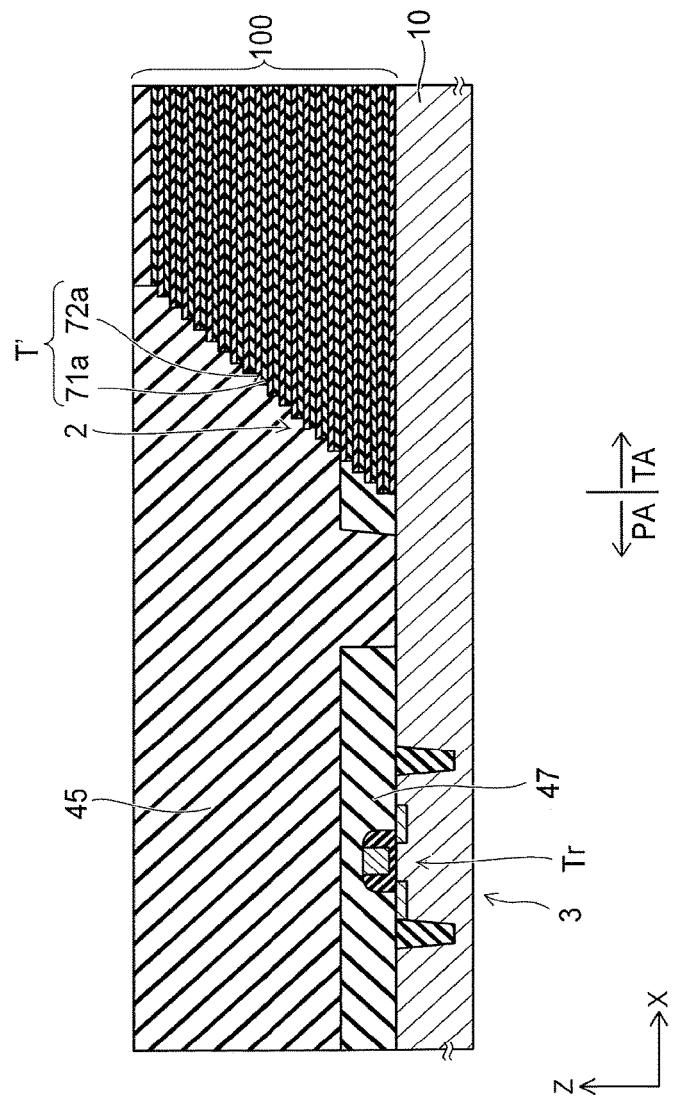

Subsequently, as shown in FIG. 19, the staircase portion 2 is formed in the stacked body 100 in the terrace region TA. A portion of the stacked body 100 is patterned into a staircase configuration; and the multiple sacrificial layers 71 include multiple terrace portions 71*a* arranged in a staircase configuration by level differences being formed along the X-direction. The multiple insulating layers 72 also are patterned into a staircase configuration; and the multiple insulating layers 72 include the multiple terrace portions 72*a* arranged in a staircase configuration by level differences being formed along the X-direction. The terrace portion 71*a* of the sacrificial layer 71 and the terrace portion 72*a* of the insulating layer 72 are included in a terrace portion T'. One terrace portion T' includes one terrace portion 71*a*, and one terrace portion 72*a* stacked on the one terrace portion 71*a*.

A portion of the insulating layer 45 shown in FIG. 18 also may be etched when forming the staircase portion 2. As shown in FIG. 19, the insulating layer 45 is formed on the staircase portion 2 and on the portion where the insulating layer 45 was removed. The insulating layer 45 is formed to cover the staircase portion 2; and subsequently, the upper surface of the insulating layer 45 is planarized.

Figure 9:
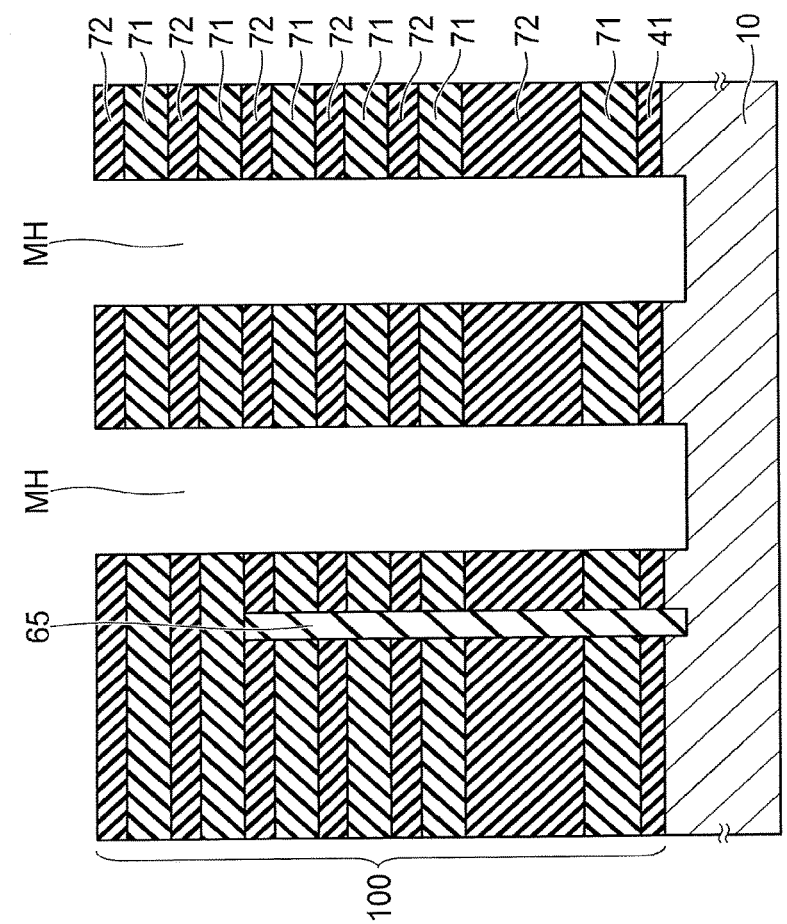

After forming the insulating layer 45, multiple memory holes MH are formed in the stacked body 100 of the memory region MA by, for example, RIE using a not-illustrated mask as shown in FIG. 9. The memory holes MH pierce the stacked body 100 and reach the substrate 10. The substrate 10 is exposed at the bottoms of the memory holes MH.

Figure 10:
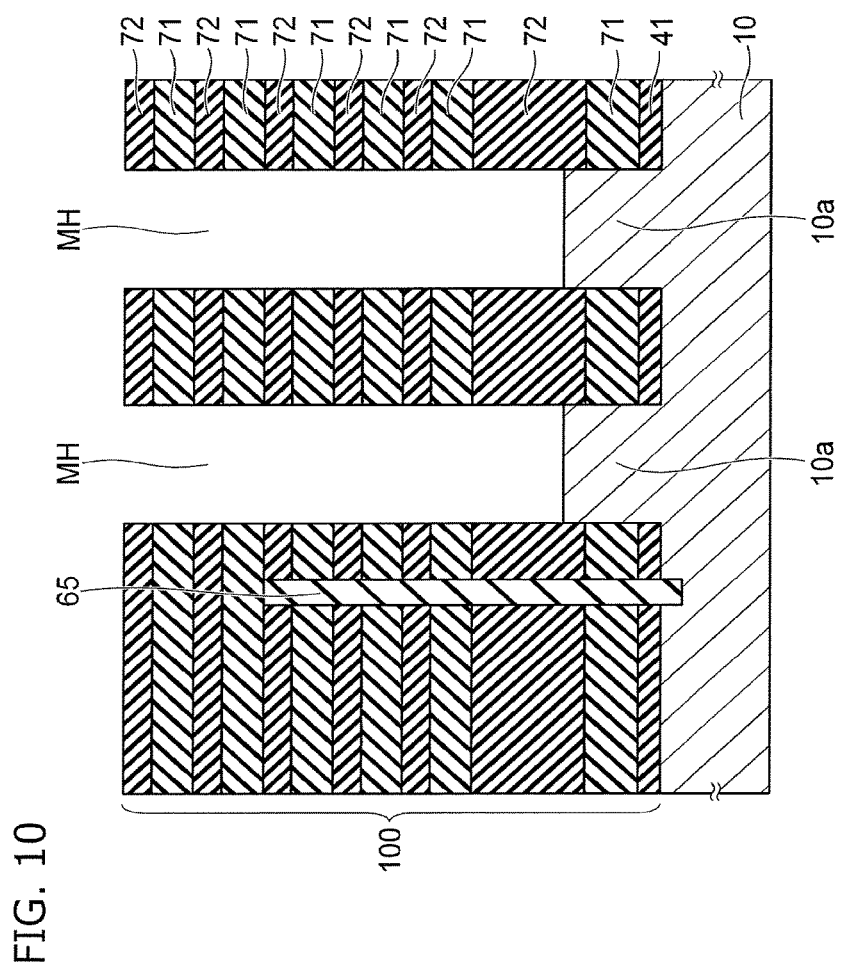

The silicon that is the substrate material is epitaxially grown from the exposed portions of the substrate 10 at the bottoms of the memory holes MH. As shown in FIG. 10, the protrusions 10*a* are formed at the bottoms of the memory holes MH as crystal layers of silicon.

The protrusions 10*a* are grown to a height that is higher than the upper surface of the lowermost sacrificial layer 71 and lower than the upper surface of the lowermost insulating layer 72.

Figure 11:
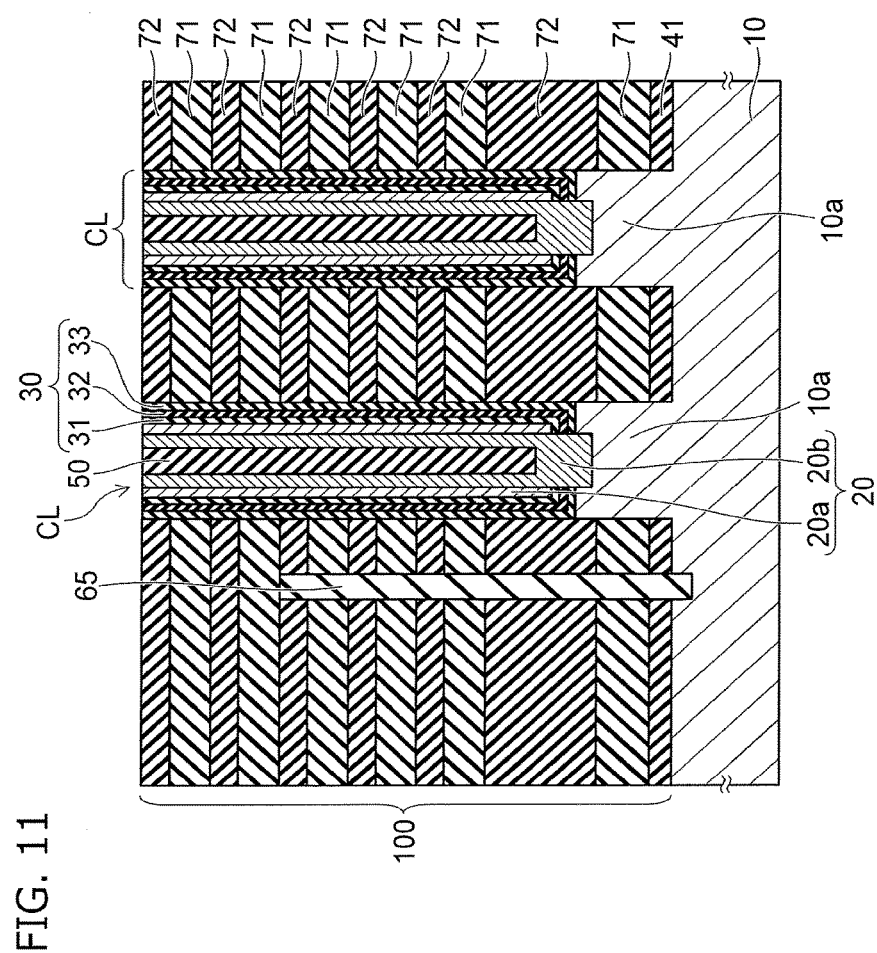

As shown in FIG. 11, the columnar portions CL are formed inside the memory holes MH on the protrusions 10*a*.

First, the memory film 30 is formed conformally along the side surface of the memory hole MH and the upper surface of the protrusion 10*a*. A cover silicon film 20*a* is formed conformally on the inner side of the memory film 30.

Subsequently, the cover silicon film 20*a* and the memory film 30 that are deposited on the upper surface of the protrusion 10*a* inside the memory hole MH are removed by RIE. The upper surface of the protrusion 10*a* is exposed at the bottom of the memory hole MH. In the RIE, the memory film 30 formed on the side surface of the memory hole MH is protected by being covered with the cover silicon film 20*a* and is not damaged by the RIE.

Subsequently, a silicon film 20*b* is formed conformally inside the memory hole MH. The lower end of the silicon film 20*b* contacts the protrusion 10*a*. The cover silicon film 20*a* and the silicon film 20*b* are included in the semiconductor body 20 described above.

The core film 50 is formed on the inner side of the semiconductor body 20. Thus, the columnar portion CL including the memory film 30, the semiconductor body 20, and the core film 50 is formed inside the stacked body 100.

Figure 12:
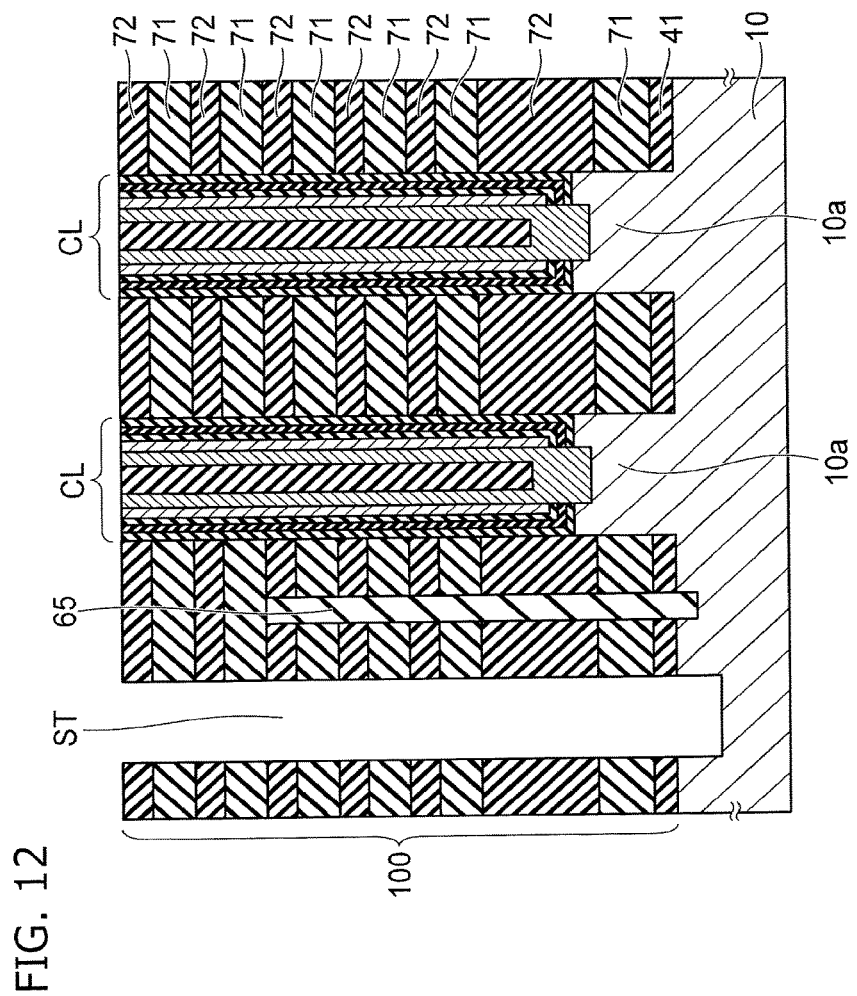

After forming the columnar portions CL, multiple slits ST are formed in the stacked body 100 as shown in FIG. 12. The slits ST are formed by RIE using a not-illustrated mask. The slits ST pierce the stacked body 100 and reach the substrate 10. As shown in FIG. 3, the slits ST extend in the X-direction and divide the stacked body 100 into the multiple blocks 200 in the Y-direction.

Then, the sacrificial layers 71 are removed by an etchant or an etching gas supplied through the slits ST. For example, the sacrificial layers 71 which are silicon nitride layers are removed using an etchant including phosphoric acid.

Figure 13:
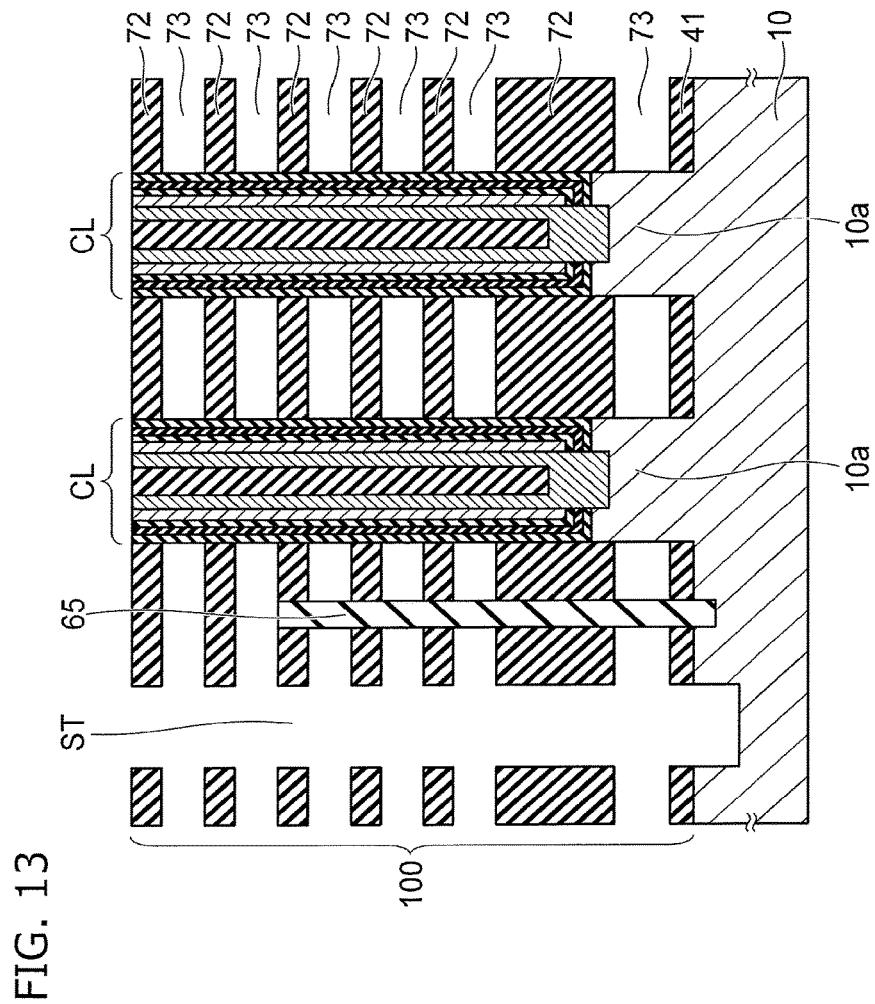
Figure 20:
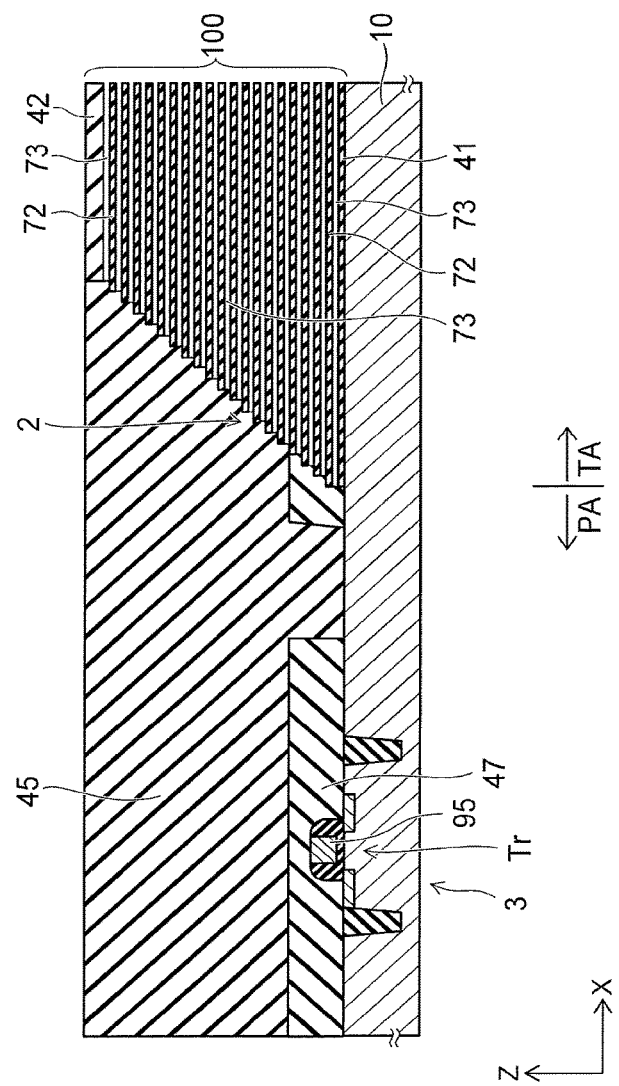

The sacrificial layers 71 are removed; and gaps 73 are formed between the insulating layers 72 adjacent to each other above and below as shown in FIG. 13 and FIG. 20. The gap 73 is formed also between the insulating layer 41 and the lowermost insulating layer 72.

The multiple insulating layers 72 contact the side surfaces of the multiple columnar portions CL to surround the side surfaces. The multiple insulating layers 72 are supported by such a physical bond with the multiple columnar portions CL; and the gaps 73 are maintained between the insulating layers 72.

Figure 14:
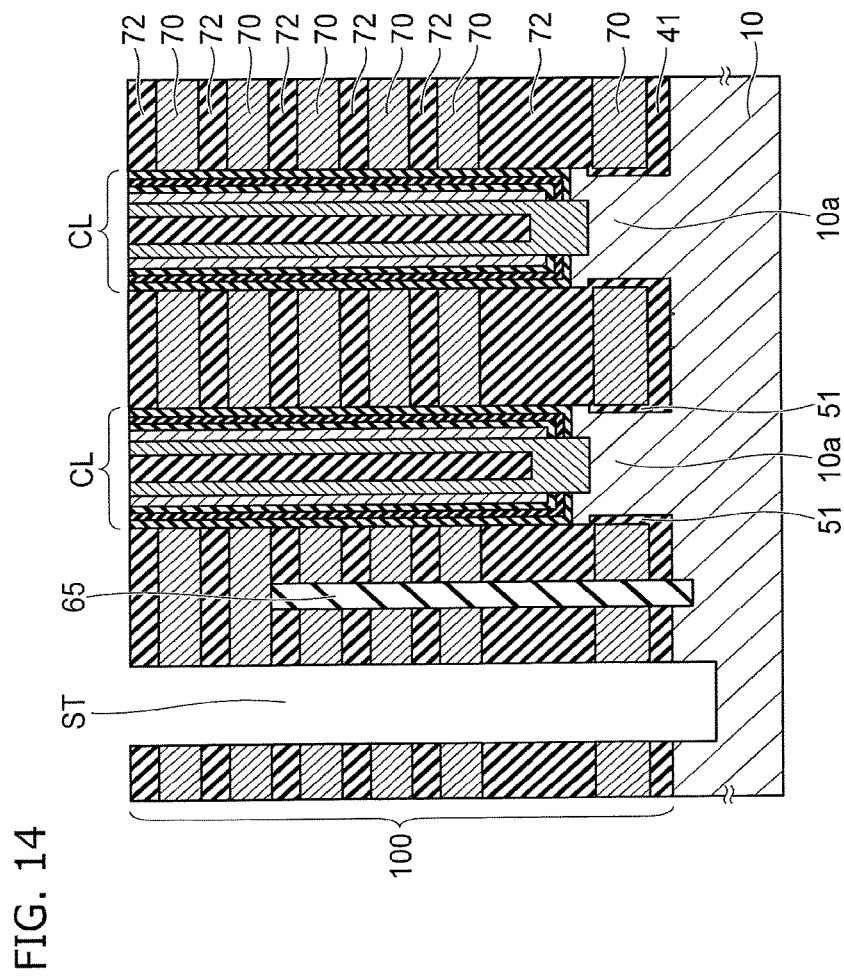

The side surfaces of the protrusions 10*a* of the substrate 10 are exposed in the gap 73 of the lowermost layer formed between the insulating layer 41 and the lowermost insulating layer 72. An insulating film is grown by performing thermal oxidation of these exposed portions including silicon. As shown in FIG. 14, a silicon oxide film is formed as the insulating film 51 on the side surfaces of the protrusions 10*a*.

Figure 21:
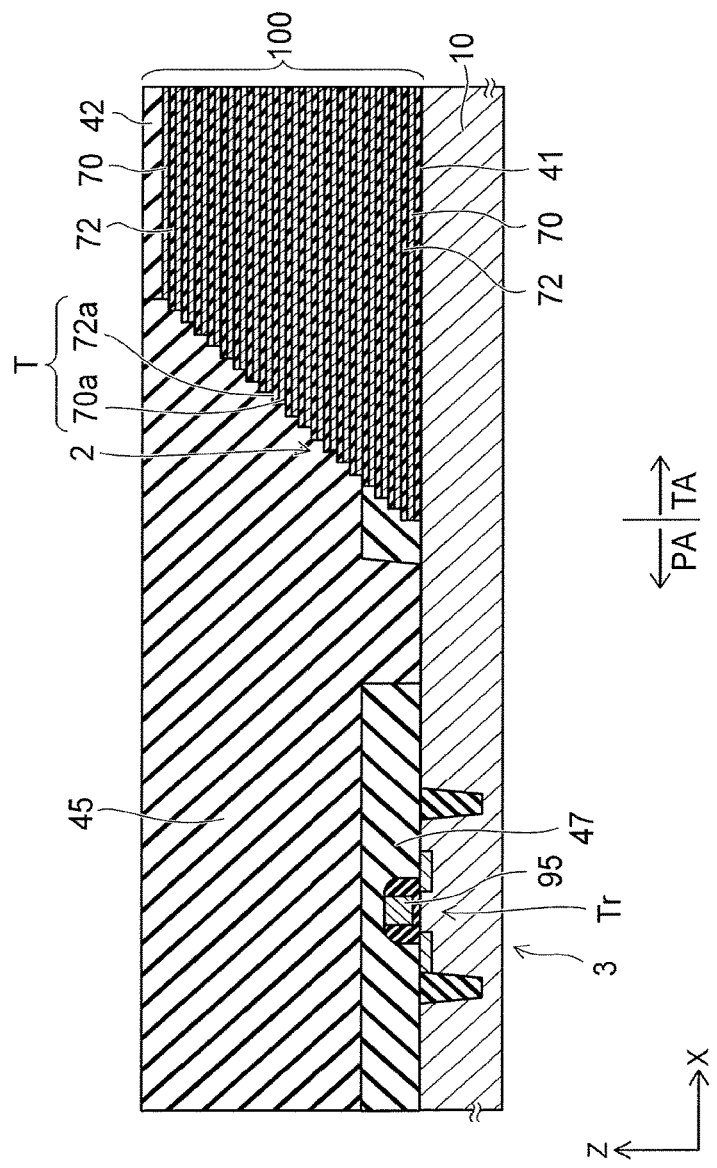

Subsequently, as shown in FIG. 14 and FIG. 21, the electrode layers 70 are formed in the gaps 73. For example, tungsten layers or molybdenum layers are formed as the electrode layers 70 by using CVD (chemical vapor deposition). A source gas is supplied to the gaps 73 through the slits ST.

Subsequently, the insulating film 61 is formed on the side surface and the bottom surface of the slit ST. After the insulating film 61 formed on the bottom surface of the slit ST is removed by RIE, the conductive material LI shown in FIG. 4 is filled into the insulating film 61 inside the slit ST. The lower end of the conductive material LI contacts the substrate 10.

Figure 22:
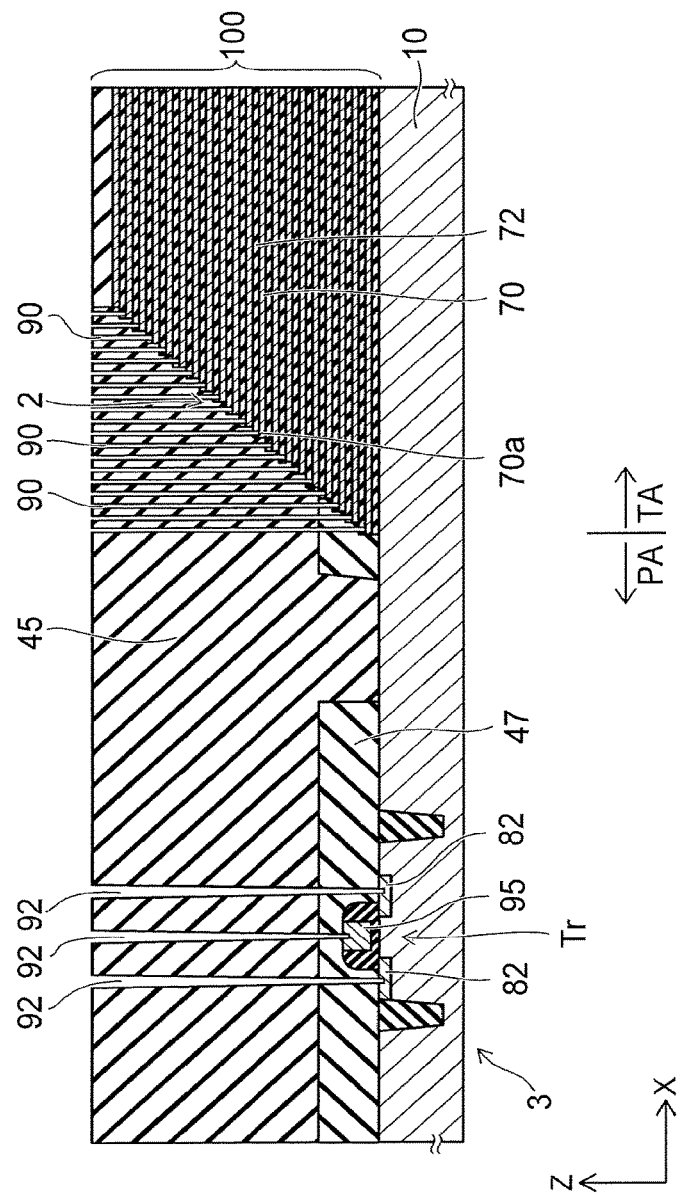

Subsequently, as shown in FIG. 22, multiple contact holes 90 are formed inside the insulating layer 45 on the staircase portion 2. The contact holes 90 extend through the insulating layer 45 in the Z-direction and reach the terrace portions 70*a* of the electrode layers 70.

As shown in FIG. 5, the contact portions 91 are formed by filling a conductive material including a metal into the contact holes 90.

Also, as shown in FIG. 22, multiple contact holes 92 are formed inside the insulating layer 45 on the circuit portion 3. The contact holes 92 extend through the insulating layer 45 in the Z-direction, and reach the semiconductor regions 82 and the gate electrode 95 of the transistor Tr.

As shown in FIG. 5, the contact portions 93 are formed by filling a conductive material including a metal into the contact holes 92.

The contact holes 90 and the contact holes 92 may be formed simultaneously or may be formed in separate processes. The contact portions 91 and the contact portions 93 may be formed simultaneously or may be formed in separate processes.

Figure 23:
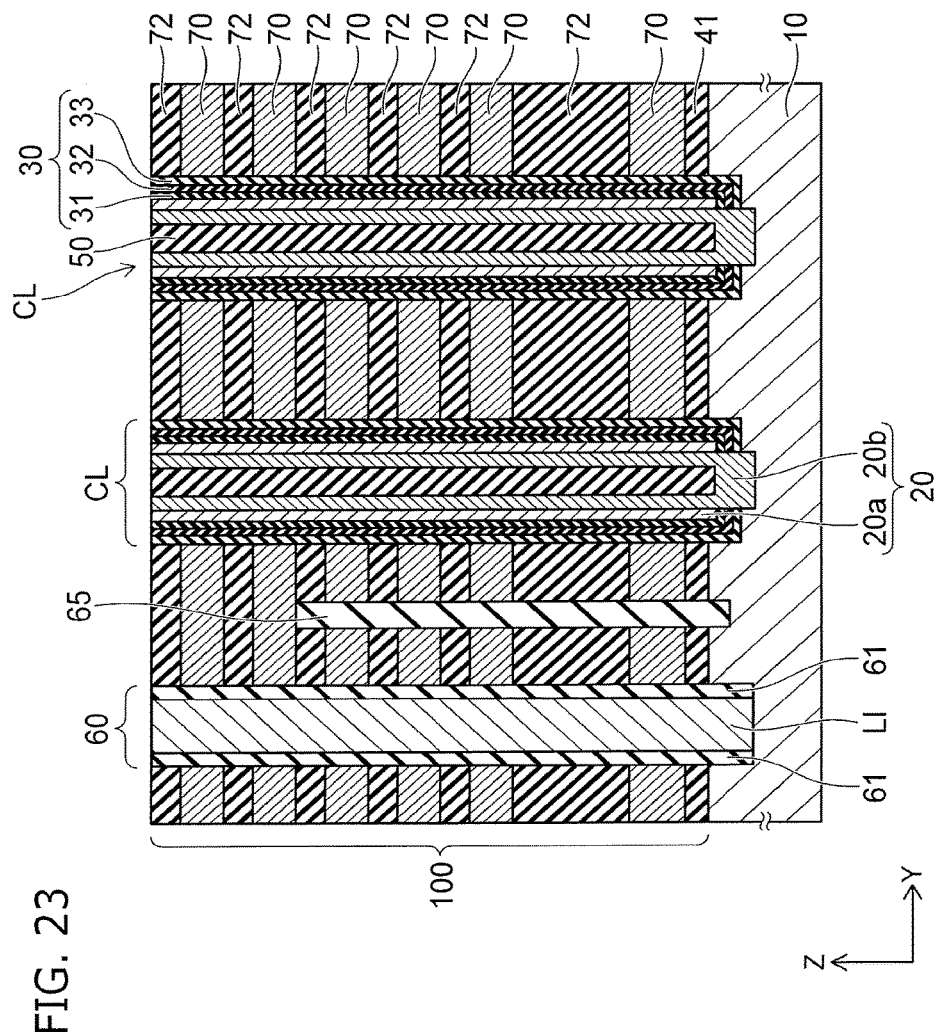
FIG. 23 is a schematic cross-sectional view of a memory cell array of the semiconductor device according to the embodiment of the invention.

FIG. 23 is a schematic cross-sectional view of another example of the memory cell array of the semiconductor device according to the embodiment of the invention.

In the example shown in FIG. 23, the protrusion is not provided in the substrate 10; and the semiconductor body 20 of the columnar portion CL directly contacts the surface of the substrate 10.

In the structure shown in FIG. 23 as well, the wall portion 65 is disposed between the separation portion 60 and the columnar portion CL of the multiple columnar portions CL most proximal to the separation portion 60.

The crack due to the peeling of the lower end of the conductive material LI such as that described above may propagate along the interface between the substrate 10 and the insulating layer 41. In the case where the crack reaches the lower end of the columnar portion CL, peeling may occur between the substrate 10 and the lower end of the semiconductor body 20.

Even in the case where the lower end of the conductive material LI peels from the substrate 10 and the crack propagates along the interface recited above toward the lower end of the columnar portion CL, the wall portion 65 stops the propagation of the crack. Accordingly, the conduction defect between the conductive material LI and the semiconductor body 20 due to the peeling between the substrate 10 and the lower end of the semiconductor body 20 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a substrate;
    a stacked body provided above the substrate, the stacked body including a plurality of electrode layers stacked with an insulator interposed;
    a plurality of columnar portions extending through the stacked body in a stacking direction of the stacked body;
    a separation portion extending through the stacked body in a first direction and separating the stacked body into a plurality of blocks in a second direction, the second direction crossing the first direction, the separation portion including a conductive material contacting the substrate;
    a plurality of wall portions arranged in the first direction to be separated from each other, the wall portions disposed between the separation portion and a columnar portion of the plurality of columnar portions most proximal to the separation portion, the wall portions piercing a lowermost electrode layer of the plurality of electrode layers and piercing an interface between the substrate and the stacked body.

2. The device according to claim 1, wherein
    the substrate includes a plurality of protrusions piercing the lowermost electrode layer, and
    the columnar portions are provided on the protrusions.

3. The device according to claim 1, wherein the columnar portions include a plurality of semiconductor bodies extending through the stacked body in the stacking direction and contacting the substrate.

4. The device according to claim 3, wherein a charge storage portion is provided between one of the semiconductor bodies and one of the electrode layers.

5. The device according to claim 2, wherein the columnar portions include a plurality of semiconductor bodies extending through the stacked body in the stacking direction and contacting the protrusions.

6. The device according to claim 5, wherein a charge storage portion is provided between one of the semiconductor bodies and one of the electrode layers.

7. The device according to claim 1, wherein the wall portion includes an insulating film provided in at least a portion adjacent to the lowermost electrode layer.

8. The device according to claim 1, wherein a spacing between the wall portions adjacent to each other in the first direction is less than a length in the first direction of one of the wall portions.

9. The device according to claim 1, wherein a lower end of the wall portion is positioned higher than a lower end of the conductive material.

10. The device according to claim 1, wherein the conductive material includes silicon.

11. The device according to claim 1, wherein the conductive material includes a metal.

12. The device according to claim 1, wherein the separation portion includes an insulating film provided between the conductive material and the stacked body.

13. The device according to claim 1, further comprising a source line provided above the stacked body and electrically connected to an upper end of the conductive material.

14. The device according to claim 1, wherein the wall portion pierces lower electrode layers including the lowermost electrode layer, the wall portion not piercing upper electrode layers other than the lower electrode layers.

15. A method for manufacturing a semiconductor device, comprising:
    forming a stacked body above a substrate, the stacked body including a plurality of first layers and a plurality of second layers, the first layers and the second layers including a first layer and a second layer stacked alternately;
    forming a plurality of wall portions piercing a lowermost first layer of the plurality of first layers and piercing an interface between the substrate and the stacked body;
    forming a plurality of columnar portions inside a plurality of holes, the holes piercing the stacked body and reaching the substrate; and
    forming a conductive material contacting the substrate inside a first slit, the first slit extending through the stacked body in a first direction and separating the stacked body into a plurality of blocks in a second direction crossing the first direction,
    the wall portions being arranged in the first direction to be separated from each other, and located between the conductive material and a columnar portion of the plurality of columnar portions most proximal to the conductive material.

16. The method according to claim 15, further comprising forming a plurality of protrusions at bottoms of the holes by causing a material of the substrate to grow,
    the columnar portions being formed on the protrusions.

17. The method according to claim 15, wherein
    the forming of the stacked body includes forming a lower layer portion above the substrate and stacking an upper layer portion on the lower layer portion, the lower layer portion including at least the lowermost first layer, and
    the forming of the wall portion includes forming an insulating film inside a second slit before the stacking of the upper layer portion, the second slit extending in the first direction, piercing the lower layer portion, and reaching the substrate.

18. The method according to claim 15, wherein the first slit and the conductive material are formed after the forming of the columnar portions and the wall portion, and the columnar portions are formed after the forming of the wall portion.

19. The method according to claim 15, further comprising replacing the plurality of first layers with a plurality of electrode layers through the first slit.

\* \* \* \* \*